United States Patent [19]

Chen et al.

[11] Patent Number: 5,077,591
[45] Date of Patent: Dec. 31, 1991

[54] ELECTROSTATIC DISCHARGE PROTECTION FOR SEMICONDUCTOR INPUT DEVICES

[75] Inventors: Kueing L. Chen; Roland H. Pang, both of Plano, Tex.

[73] Assignee: Texas Instruments Incorporated, Dallas, Tex.

[21] Appl. No.: 206,953

[22] Filed: Jun. 8, 1988

Related U.S. Application Data

[63] Continuation of Ser. No. 914,048, Sep. 30, 1986, abandoned.

[51] Int. Cl.$^5$ .................... H01L 29/06; H01L 29/78; H01L 29/74; H01L 27/02
[52] U.S. Cl. ................................. 357/23.13; 357/38; 357/41; 357/13
[58] Field of Search ................. 357/23, 13, 41, 38; 361/56, 91

[56] References Cited

U.S. PATENT DOCUMENTS

| | | | |
|---|---|---|---|
| 4,400,711 | 8/1983 | Avery | 357/38 |
| 4,484,244 | 11/1984 | Avery | 361/56 |
| 4,626,882 | 12/1986 | Cottrell et al. | 357/23.13 |
| 4,633,283 | 12/1986 | Avery | 357/23.13 |
| 4,757,363 | 7/1988 | Bohm et al. | 357/23.13 |

FOREIGN PATENT DOCUMENTS 2090701 7/1982 United Kingdom ............ 357/23.13

*Primary Examiner*—Rolf Hille
*Assistant Examiner*—Mahshid Saadat
*Attorney, Agent, or Firm*—B. Peter Barndt; James T. Comfort; Melvin Sharp

[57] ABSTRACT

A method and structure for protecting an integrated circuit from electrostatic discharges are disclosed. A Shockley diode (22) is connected to an input bond pad (12) and to a MOSFET transistor (17) which is desired to be protected. The normally high breakdown voltage required to drive the Shockley diode (22) into conduction is reduced by providing a trigger transistor (24) for prematurely triggering the diode (22). When the base-collector junction of the common emitter configured trigger transistor (24) is driven into avalanche breakdown by the electrostatic discharge, charged carriers (60) are generated, and attracted by the Shockley diode (22). The base (54) of the trigger transistor (24) is biased during normal operations iwth a supply voltage, and during electrostatic discharges to a higher voltage by an inherent Zener diode (64). When normal power is applied to the integrated circuit (10), input latch-up immunity is enhanced, and when an electrostatic discharge appears at the input bond pad (12), the electrostatic discharge protection is enhanced.

12 Claims, 1 Drawing Sheet

5,077,591

ELECTROSTATIC DISCHARGE PROTECTION FOR SEMICONDUCTOR INPUT DEVICES

This application is a continuation of the U.S. Pat. application Ser. No. 06/914,048, filed Sept. 30, 1986 and now abandoned.

TECHNICAL FIELD OF THE INVENTION

The present invention relates in general to semiconductor circuits, and more particularly to methods and circuits for protecting semiconductor structures from electrostatic discharges.

BACKGROUND OF THE INVENTION

Metal oxide silicon field effect transistors (MOSFETs) are highly susceptible to damage from exposure to electrostatic discharges. The gate conductor of a MOSFET device is separated from an underlying source, drain and conduction channel semiconductor region by a very thin insulating layer. The insulating layer is typically constructed of silicon dioxide ($SiO_2$) having a thickness of about 200 angstroms. The breakdown voltage of a high quality silicon dioxide layer of such thickness may only be about 20 volts. Electrostatic voltages may range from several hundred volts to several thousand volts. Such voltages can be easily generated and discharged by a person touching the terminals of an integrated circuit, or the equipment housing the circuit. Therefore, when the gate conductor of a MOSFET device is used as an input to a packaged integrated circuit, the inadvertent application of an electrostatic voltage thereto can destroy the input transistor.

One approach previously utilized in providing electrostatic discharge protection is to connect a Shockley diode (a two terminal SCR) to the gate of the input transistor. The Schottky diode is formed as a four layer device with alternate P and N junctions. The disadvantage with this approach is that when the Schottky diode is fabricated in accordance with conventional integrated circuit processing steps, such diode does not break down until the electrostatic voltage reaches about one hundred volts. It is apparent that with one hundred volts applied to the input of a MOSFET integrated circuit, it is highly likely that the circuit will be damaged. The one hundred volt breakdown of the Schottky diode arises from the formation of an N-well in a P-type substrate to fabricate one junction of the four layer diode device. This junction exhibits the largest breakdown voltage of the Schottky device, which voltage must be exceeded in order to turn on the diode.

Other attempts to provide electrostatic discharge protection include the provision of a gateless MOSFET transistor connected across the input device to be protected. Under normal operating conditions, the protection device would remain in a nonconductive state, as it has no gate or conduction channel. Rather, there is formed in lieu of a conduction channel an insulating silicon dioxide which allows conduction therearound only when a relatively high voltage is impressed between the semiconductor source and drain regions. This approach requires a substantial amount of wafer area, added input capacitance to the circuit, and is generally difficult to fabricate with a closely controlled breakdown voltage.

From the foregoing, it can be seen that a need exists for an improved method and circuit for protecting the inputs of semiconductor circuits. Particularly, a need exists for clamping electrostatic voltages to a safe level without damaging either the circuits to be protected, or the protection circuit itself.

SUMMARY OF THE INVENTION

In accordance with the present invention, the disclosed electrostatic discharge protection circuit reduces or eliminates the disadvantages and shortcomings associated with the prior art methods and structures. According to the protection circuit of the invention, small electrostatic voltages are used to generate charged carriers which are used to trigger a Schottky clamp diode, thereby limiting the electrostatic voltages to magnitudes significantly lower than the one hundred volt breakdown heretofore experienced.

A vertical bipolar trigger transistor is formed in the semiconductor substrate adjacent the Schottky diode. The bipolar transistor is fabricated in a common emitter configuration so that it exhibits a low breakdown voltage. When the voltage of the electrostatic discharge reaches about twenty volts, the emitter-base junction of the trigger transistor becomes forward biased and the base-collector junction becomes reverse biased. The electrons and the holes generated by the avalanche breakdown of the reverse biased base-collector junction are attracted to the Schottky diode, thereby prematurely turning it on before it is driven into breakdown conduction by a much higher electrostatic voltage.

In the preferred form of the invention, the bipolar trigger transistor is of the PNP type. Also, the trigger transistor is formed with the base thereof connected to a supply voltage input terminal of the integrated circuit. In this manner, during normal powered operations of the circuit, any overshoot or transient voltage appearing on the input is clamped to a low voltage, thereby preventing latch-up. In CMOS and MOSFET circuits, latch-up is an undesirable characteristic which can occur during power-up of the circuit, or as a result of input voltage overshoots which can drive inherent parasitic SCR's into a latched state. However, during electrostatic discharges to the input, the trigger transistor is not biased by the supply voltage, but rather is biased to a higher voltage by an inherent Zener diode formed by the overall integrated circuit which is also connected to the supply voltage terminal. The technical advantage of this biasing arrangement is that both latch-up immunity and electrostatic discharge protection are enhanced.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts throughout the views, and in which.

DETAILED DESCRIPTION OF THE INVENTION

Figure 1:
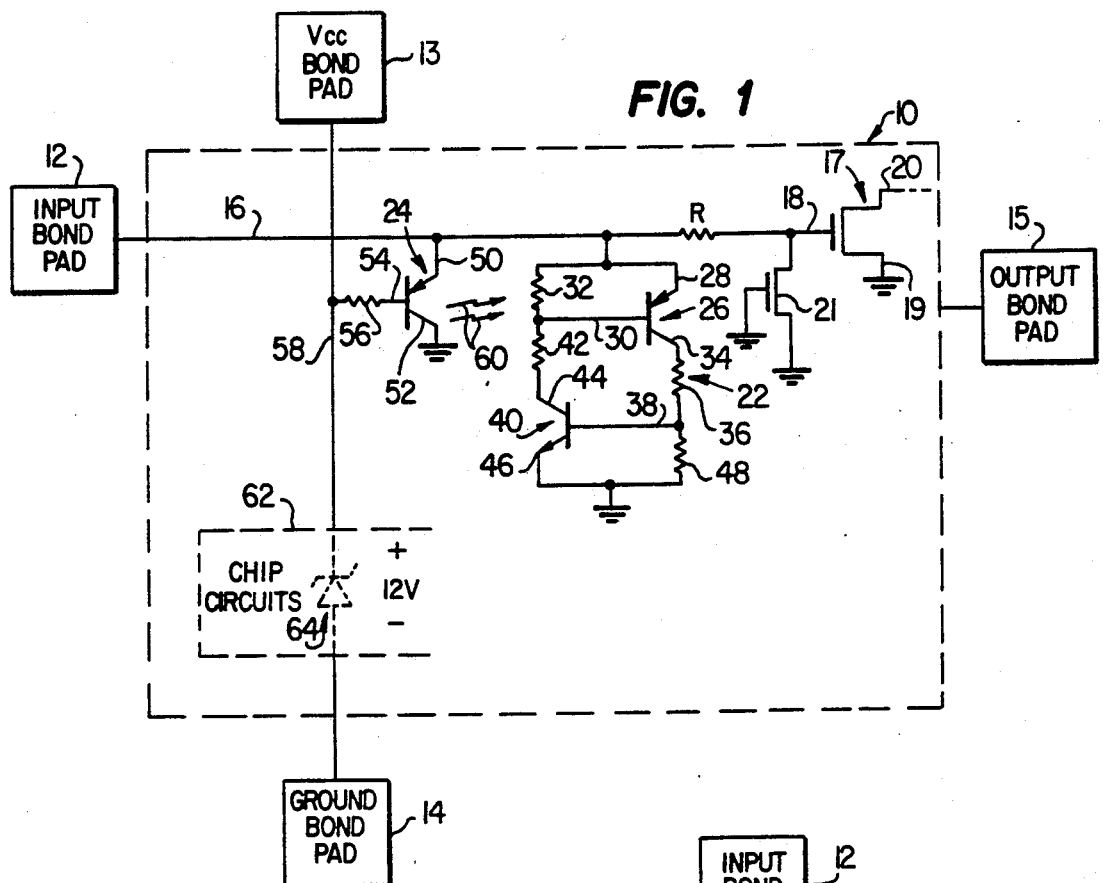
FIG. 1 is an electrical schematic drawing of an input electrostatic discharge protection circuit of the invention.

FIG. 1 is illustrative of a typical integrated circuit application in which the invention may be practiced. The input of an integrated circuit 10 is shown connected to an input bond pad 12. A supply voltage Vcc bond pad 13, ground bond pad 14 and output bond pad 15 are also shown connected to the integrated circuit 10. In practice, an integrated circuit will include many more inputs and many more outputs than shown. An input conductor 16 is utilized to connect the input bond pad 12 to an input transistor, such as MOSFET transistor 17. A resistance R is formed in series between the input bond pad 12 and the transistor 17. When the integrated circuit 10 is fabricated using the insulated gate field effect technology, the input transistor 17 will include a gate input 18, and source and drain terminals 19 and 20. The drain 20 is typically connected to other semiconductor circuits (not shown) within the integrated circuit chip 10.

A grounded gate MOSFET transistor 21 is connected between ground and the gate 18 of the input transistor 17. Transistor 21 is fabricated having a very short channel so that it reacts within a nanosecond, or less, to electrostatic voltages. Also, the transistor 21 is formed to react to electrostatic voltages by entering breakdown at about 17 volts, with a sustained secondary breakdown voltage of about 8 volts. Thus, when an electrostatic voltage is applied to the input bond pad 12, the secondary protection transistor 21 will quickly react and clamp the gate 18 of the input transistor 17 to a low voltage. Resistor R, which is about 100 ohms, limits current to both transistors 17 and 21. However, during an electrostatic discharge, the voltage across the resistor R may approach 100 volts.

In accordance with an important feature of the invention, a Schottky diode 22 is connected between the input conductor 16 and circuit ground. As noted above, the Schottky diode 22 is a four layer two-terminal SCR latching type of device. Operating in conjunction with the diode 22 is a bipolar trigger transistor 24, also connected to the conductor 16. Thus, when any voltage, such as that produced by an electrostatic discharge, appears at the input bond pad 12, such voltage is also applied to the protection circuit comprising the Schottky diode 22 and trigger transistor 24. The Schottky diode 22 comprises a PNP transistor 26 with an emitter 28 connected to the input conductor 16, and a base 30 also connected to the input conductor 16 through a resistor 32. A collector 34 of the PNP transistor 26 is connected through a resistor 36 to the base 38 of an NPN transistor 40. The base 30 of PNP transistor 26 is connected through a resistor 42 to the collector 44 of the NPN transistor 40. The emitter 46 of the NPN transistor 40 is connected to ground, while the base 38 thereof is connected through a resistor 48 to ground.

When operating in the voltage breakdown mode, e.g., when a voltage of about one hundred volts is impressed across the Schottky diode 22, each transistor 26 and 40 maintains the other transistor turned on to clamp the voltage on the input conductor 16 to a very low voltage. In accordance with the operation of a Schottky diode 22, the high voltage impressed thereacross causes the leakage currents therethrough to be of sufficient magnitude as to bias the transistors 26 and 40 into a conduction state. While the resistors illustrated in connection with diode 22 are shown as discrete elements, in practice, such resistors constitute the bulk resistances of the various semiconductor regions forming the diode.

When operating in the breakdown mode, the diode leakage currents flow downwardly through resistors 32 and 42, and resistors 36 and 48. When a voltage in excess of about 0.6 volts is developed across resistor 32, the base-emitter junction of PNP transistor 26 becomes forward biased, thereby turning the transistor on. Similarly, when the voltage across resistor 48 exceeds about 0.6 volts, the NPN transistor 40 is biased into conduction. Because the inputs and outputs of transistors 26 and 40 are cross-coupled, the transistors remain in the conduction state, even if the voltage across the diode 22 drops to several volts due to the clamping action thereof. It is apparent, therefore, that the Schottky diode 22, once driven into a conductive state, is very effective to clamp undesired voltages on the input conductor 16 toward ground. It is important that the diode 22 is not driven into conduction at typical digital voltages, such as 5-12 volts, so that such digital voltages can be coupled to the input MOSFET transistor 17 to drive other circuitry within the integrated circuit.

When an electrostatic voltage is coupled to the input conductor 16, such voltage is also impressed across the PNP trigger transistor 24. PNP transistor 24 includes an emitter 50 connected to the input conductor 16, a grounded collector 52, and a base 54 coupled through a resistor 56 to a bus 58 which normally carries the supply voltage from bond pad 13 to the remainder of the integrated circuit 10.

An electrostatic voltage impressed across the trigger transistor 24 initially forward biases the emitter-base junction thereof, but reverse biases the base-collector junction. However, the base-collector junction of the trigger transistor 24 remains reversed biased only until it reaches a secondary breakdown voltage of about 20-25 volts, whereupon the junction voltage is reduced. Thus, the trigger transistor 24 will be forced into operation, and at a lower voltage than that of the Schottky diode 22.

When the trigger transistor 24 begins operating in an secondary breakdown mode, the avalanche breakdown of the base-collector junction will generate free electrons and holes, as indicated by arrows 60. The charged carriers 60 migrate and are attracted to the semiconductor structure of the Schottky diode 22. It is important that the trigger transistor is in close proximity to the diode 22, so that the charged carriers 60 do not become substantially depleted due to recombination in the semiconductor material. When the charged carriers 60 enter the semiconductor material of the Schottky diode 22, such diode is triggered into conduction before the voltage thereacross reaches the typical one hundred volt breakdown level. With increased levels of charged carriers 60 reaching the Schottky diode 22, such diode is triggered into conduction at corresponding lower voltages thereacross.

Assuming that the diode 22 is triggered into operation on receiving the charged carriers 60, such diode 22 will begin conducting on the order of about twenty nanoseconds thereafter. This parameter is stated in general, and can be modified by changing the separation between the trigger transistor 24 and the diode 22, and the impurity concentration of such devices. The trigger transistor 24 must thus absorb the full load of the electrostatic energy for the first twenty nanoseconds before the diode 22 begins conducting. The twenty nanosecond period in which the trigger transistor 24 must absorb the electrostatic energy is not damaging to the transistor, as the base-collector junction thereof can withstand typical electrostatic energies for the noted time period. When the Schottky diode 22 is triggered into conduction, it becomes the mechanism for dissipating the energy for the remaining period of the electrostatic discharge. Since electrostatic discharges typically last no longer than about 300 nanoseconds, the high energy level, but short duration periods of electrostatic energy can be dissipated by the diode 22 without corresponding damage. In practice, electrostatic discharges of up to 8,000 volts can be dissipated by the protection circuit of the invention without damage to such protector, or to the circuit 17 desired to be protected.

The trigger transistor 24 also reduces the tendency of the integrated circuit 10 to become latched during normal operation when a transient or overshoot voltage is inadvertently applied to the input bond pad 12. For example, if a digital signal having an excessive overshoot or oscillatory ringing is applied to the input bond pad 12, the Schottky diode 22 may be driven into conduction. In the event diode 22 is fired during normal operation of the integrated circuit 10, all input signals applied to the input bond pad 12 will be short circuited to ground and prevented from being coupled to the transistor 17. Input overshoot voltages may cause sufficient leakage currents to flow through the four-layer diode 22 to cause it to turn on. In many CMOS circuits, the diode 22 may be parasitic in nature, and thus unavoidable.

According to conventional semiconductor test specifications, an input voltage transient of sufficient magnitude to cause a 300 milliamp current to flow into the input should not cause a MOSFET circuit to be driven into latch-up. The trigger transistor 24 of the invention substantially raises this requirement, and thus provides an additional margin of assurance against input latch-up.

The supply voltage bond pad 13 is connected through the chip circuits 62 to the ground bond pad 14. When the integrated circuit is not powered up, the chip circuits 62 function as an inherent Zener diode 64 with a breakdown voltage of about twelve volts. Thus, a current path caused by electrostatic voltages exists through the emitter-base junction of the trigger transistor 24 and through the inherent Zener diode 64. Accordingly, during electrostatic discharges, the base 54 of the trigger transistor 24 is biased to about twelve volts.

On the other hand, when the integrated circuit is powered up by a typical five volt supply connected to the Vcc bond pad 13, the five volts will be forced on the conductor 58 and bias the base 54 of the trigger transistor 24 to a lower voltage. With a trigger transistor base resistor 56 value of about 10 ohm, and with the 25 volts on conductor 16 required for turn-on of the protection circuit of the invention, a two amp current flow is required to cause latch-up of the Schottky diode 22. The equation illustrative of this result is:

$$\frac{25 \text{ volt} - 5 \text{ volt}}{10 \text{ ohm}} = 2 \text{ amp}$$

The foregoing illustrates that for normal circuit operations when a supply voltage of five volts is applied to the Vcc bond pad 13, and when the ground bond pad 14 is grounded, a voltage of five volts is forced across the chip circuits 62, thus negating the effect of the inherent Zener diode 64.

During the periods of time when electrostatic protection is required, e.g., when the supply voltage is removed from the Vcc bond pad 13, the electrostatic voltage which may be applied to the input bond pad 12 causes the inherent Zener diode 64 to become active, thereby biasing the base resistor 56 to about twelve volts. In this situation, the input current required to cause latch-up of the Schottky diode is reduced, thereby enhancing latch-up protection of the integrated circuit 10. The input current requirement is calculated as follows:

$$\frac{25 \text{ volt} - 12 \text{ volt}}{10 \text{ ohm}} = 1.3 \text{ amp}$$

It can be seen that because different voltages are applied to the base of the trigger transistor 24 during different modes of operation, the input latch-up immunity and the electrostatic protection features are both improved. For input latch-up immunity, the voltage at the base of the trigger transistor 24 is reduced to the voltage applied to the Vcc bond pad 13, while during electrostatic protection the base voltage of the trigger transistor 24 is raised to that of the breakdown voltage exhibited by the inherent Zener diode 64.

Figure 2:
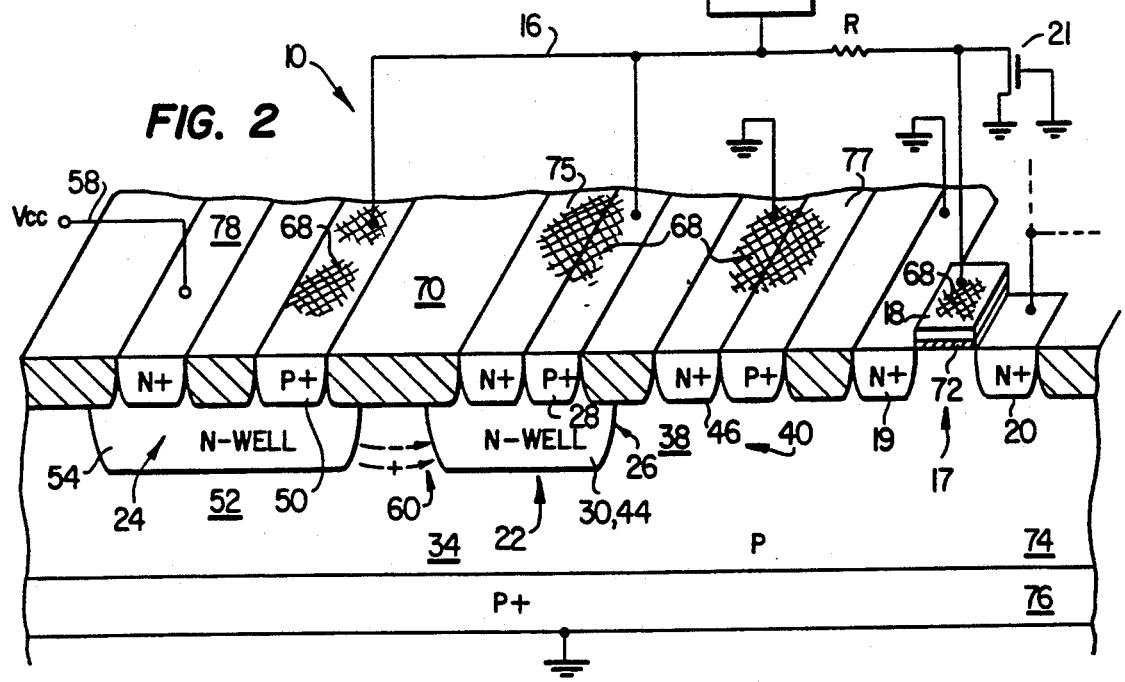
FIG. 2 is an oblique view of a sectioned portion of a semiconductor wafer incorporating the electrostatic discharge protection technique of the invention.

FIG. 2 illustrates the electrostatic protection circuit of the invention as embodied in the wafer of the integrated circuit 10. The semiconductor regions are identified by the same reference characters as the corresponding terminals of the circuits shown in FIG. 1.

The input bond pad 12 is shown connected to the P. semiconductor region 50, to a P. semiconductor region 28 and to the gate conductor 18 of the input MOSFET transistor 17. The gate conductor 18 of the input MOSFET transistor 17 is typically constructed of doped polycrystalline silicon, and includes a conductive silicide covering 68 functioning as an interface to the conductor 16 extended to the input bond pad 12. Other noted semiconductor regions are also covered with a silicide 68 for providing a conductive interface to the respective conductors. A thick field silicon dioxide insulation, such as indicated by 70, provides electrical insulation between the various semiconductor regions of the invention. The input MOSFET transistor 17 is illustrated as a conventional N-channel device, including source and drain regions 19 and 20, and the gate conductor 18 insulated from the face of the semiconductor by a thin insulator 72. As noted above, the gate insulator 72 is often made of silicon dioxide, with a thickness exibiting a breakdown voltage on the order of twenty volts.

The secondary protection circuit comprising resistor R and transistor 21 are shown in schematic form. As noted above, the resistor R is connected between the input transistor 17 and the electrostatic protection diode 22 and associated bipolar trigger transistor 24. The resistor R can be formed using conventional semiconductor fabrication techniques.

The Schottky diode 22 includes an emitter-base junction formed by the diffusion of a P+ impurity 28 into an N-well 30 and 44. The noted N-well is designated with both reference characters 30 and 44 as such semiconductor region functions as the base of PNP transistor 26 and the collector of NPN transistor 40. A region 34 of a P-type epitaxial layer 74 formed on a P+ substrate 76 provides the collector of the diode PNP transistor 26. A portion 38 of the P-type epitaxial layer 74 is common with region 34, and forms the base region of the diode NPN transistor 40. Lastly, the N semiconductor region 46 comprises the emitter of NPN transistor 40. The various resistances identified above with regard to the Schottky diode 22 comprise the bulk resistance of the various semiconductor regions and wells.

Additional semiconductor regions associated with the Schottky diode are identified as 75 and 77. The paired N+ and P+ semiconductor regions are connected by an overlying conductive silicide to form a conventional butted contact. The N+ semiconductor region 75 and the P+ semiconductor region 77 further enhance the latch-up immunity of the Schottky diode 22.

The trigger transistor 24 comprises the P. emitter region 50, as noted above, diffused into an N-well 54 forming the base of such transistor 24. The collector 52 comprises a portion of the P-type epitaxial layer 74. The field dioxide 70 provides surface electrical isolation between the trigger transistor 24 and the Schottky diode 22. Below the surface of the wafer in an area underlying the dioxide 70, and separating the transistor 24 from the diode 22, is an area in epitaxial layer 74 wherein charged carriers 60 are transferred from the trigger transistor 24 to the Schottky diode 22.

More specifically, the reversed biased trigger transistor base-collector junction, comprising the base N-well 54 and the collector 52, generates charged carriers 60 when driven beyond second breakdown into an avalanche mode. The charged carriers 60 are attracted by the N-well 30 forming the base semiconductor region of the Schottky diode PNP transistor 26. The N-well 30 thus forms an input to the Schottky diode 22 which attacts the charged carriers 60 and significantly lowers the breakdown voltage necessary to drive the diode 22 into conduction.

The electrostatic discharge circuit described above is effective to provide internal nondestructive dissipation of very high electrostatic or similar amplitude voltages. Specifically, for large positive polarity voltages applied to the input bond pad 12, the trigger transistor 24 will be driven into an avalanche mode, thereby triggering the Schottky diode 26. For large negative voltages applied to the input bond pad 12, the grounded P. substrate 76 will appear as a positive potential, wherein a PN Junction comprising P-type regions 76 and 74 and N-type regions 30 and 75 will be forward biased and short circuit the discharge. In essence, the negative discharge will cause a current to flow through the noted junction from ground to the source of the negative electrostatic discharge.

The N-well forming the base 54 of the trigger transistor 24 is also in electrical contact with a heavily N-doped semiconductor region 78 which is connected to the Vcc bond pad 13. While not specifically shown, the other circuits 62 of the integrated circuit chip 10 are also connected to Vcc bond pad 13, and thus are indirectly connected to the N. semiconductor region 78. Thus, any voltage which is coupled to the input bond pad 12, such as an overshoot or electrostatic voltage, is also carried through the P+ region 50, the N-well 54 and N+ region 78 to the other chip circuits 62. Since the inherent voltage developed across the chip circuits 62 will be a nominal twelve volts, such voltage appears at the N-well 54, and thus at the base of the trigger transistor 24. The base resistor 56 is not shown in FIG. 2, but comprises the bulk resistance of the semiconductor material forming the N-well 54. With the N-well 54 connected indirectly to the other chip circuits 62, both the latch-up immunity and the electrostatic discharge protection capability is enhanced.

TECHNICAL ADVANTAGES OF THE INVENTION

From the foregoing, an electrostatic discharge protection method and structure have been disclosed. The technical advantage of the invention is that the electrostatic discharge protector which is connected in parallel across the circuit to be protected, is driven into conduction at a much lower voltage, and thereby provides a substantial safety margin to the circuits. The technical advantage of the reduced turn-on voltage is provided by a trigger transistor which generates charged carriers which, when accumulated by the clamp circuit, causes the breakdown voltage thereof to be substantially reduced.

A secondary protection circuit comprising a current limiting resistor and a high speed clamp transistor provide fast initial protection to the circuit to be protected. The technical advantage of the combination of the high speed clamp and the diode and trigger transistor is that electrostatic discharge protection is provided from the time the voltage rises to a dangerous level, until it is clamped by the high power diode clamp of the invention.

An additional technical advantage of the invention is that a bias voltage of different magnitudes can be applied to the base of the trigger transistor so that less input current from the input bond pad is required to protect the circuit from electrostatic discharges, and more current is required for latch-up of the circuit. With increased latch-up current required, the latch-up immunity of the circuit is improved.

While the principles and concepts of the invention have been set forth above, it is to be understood that such methods and structure are not limited by this disclosure. Therefore, while the preferred embodiment of the invention has been disclosed in connection with a specific method and structure, it is to be understood that many changes in detail may be made as a matter of engineering choices without departing from the spirit and scope of the invention as defined by the appended claims.

What is claimed is:

1. A circuit for providing electrostatic discharge protection to an integrated circuit, comprising:
   a latching device operable to withstand both positive and negative electrostatic energy with a voltage magnitude above a predetermined level, formed in the integrated circuit and connected across a circuit to be protected, said latching device having a breakdown voltage level at which said latching device turns on; and
   a bipolar trigger transistor formed in the integrated circuit and connected to the circuit to be protected and coupled to said latching device through a conduction path comprised of a semiconductor region for transferring charge carriers between said latching device and said trigger transistor during avalanche breakdown of the collector-base junction of the trigger transistor, said trigger transistor generating a trigger current output to said latching device to lower the breakdown voltage at which the latching device turns on.

2. The electrostatic discharge protector of claim 1 wherein said latching device comprises an SCR type device.

3. The electrostatic discharge protector of claim 1 wherein said latching device comprises a semiconductor device having four layers of alternating conductivity type, having one layer thereof connected to the circuit to be protected, and another layer thereof connected to a ground of said integrated circuit.

4. The electrostatic discharge protector of claim 1 further including a doped semiconductor layer in which said trigger transistor and said latching device are formed, said doped semiconductor layer also forming said conduction path.

5. The electrostatic discharge protector of claim 4 wherein said transistor is formed in said doped semiconductor layer proximate said latching device so that sufficient said charged carriers reach said latching device before being recombined with oppositely charged carriers in said doped semiconductor layer.

6. The electrostatic discharge protector of claim 1 further including means for biasing said trigger transistor at a first point so that said trigger transistor is responsive to a first voltage level coupled to said circuit to be protected, and biased at a second point so that said trigger transistor is responsive to a second voltage level coupled to said circuit to be protected.

7. The electrostatic discharge protector of claim 6 wherein said trigger transistor is connected to said integrated circuit so that said trigger transistor is biased to a supply voltage of said integrated circuit.

8. The electrostatic discharge protector of claim 1 further including in combination a current limiter in series between an input to the integrated circuit, and a high speed transistor connected across ground and the circuit to be protected.

9. An electrostatic discharge protection circuit for an integrated circuit, comprising:
 a four layer semiconductor structure connected across a device to be protected in the integrated circuit, said four layer structure comprising alternate P-type and N-type impurity regions, said semiconductor structure having a voltage level at which conductive current flow occurs across said semiconductor structure for both positive and negative voltages; and
 a semiconductor junction spaced from said four layer structure by a doped semiconductor material forming a conduction path, said junction operable in an avalanche breakdown mode when an electrostatic voltage is applied thereto, charge carriers generated by said avalanche breakdown being transferred through said conduction path and connected by said four layer structure to thereby lower the voltage level at which said conductive current flow occurs, wherein said junction comprises a base-collector junction of a bipolar transistor connected across the device to be protected.

10. The electrostatic protection circuit of claim 9 wherein said bipolar transistor comprises a PNP type transistor with an emitter thereof connected to the device to be protected.

11. The electrostatic discharge protection circuit of claim 9 wherein said bipolar transistor includes a base connected to a supply voltage bus of the integrated circuit.

12. The electrostatic discharge protection circuit of claim 9 wherein said bipolar transistor includes a base biased to a first voltage when a supply voltage is connected to the integrated circuit, and biased to a second voltage on the occurrence of an electrostatic discharge applied to the device to be protected.

* * * * *